United States Patent

Larsen et al.

(10) Patent No.: US 6,690,022 B2
(45) Date of Patent: Feb. 10, 2004

(54) ION BEAM INCIDENCE ANGLE AND BEAM DIVERGENCE MONITOR

(75) Inventors: Grant Kenji Larsen, Gloucester, MA (US); Ashwin Purohit, Gloucester, MA (US); Robert A. Poitras, Rockport, MA (US); Morgan Evans, Manchester-by-the-Sea, MA (US); Damian Brennan, Gloucester, MA (US)

(73) Assignee: Varian Semiconductor Equipment Associates, Inc., Gloucester, MA (US)

( * ) Notice: Subject to any disclaimer, the term of this patent is extended or adjusted under 35 U.S.C. 154(b) by 158 days.

(21) Appl. No.: 10/050,636

(22) Filed: Jan. 16, 2002

(65) Prior Publication Data

US 2002/0121889 A1 Sep. 5, 2002

Related U.S. Application Data

(60) Provisional application No. 60/262,245, filed on Jan. 17, 2001.

(51) Int. Cl.[7] .............................. H01J 37/08; A61N 5/00
(52) U.S. Cl. .............................. 250/492.21; 250/492.2; 250/423 R; 250/492.3; 250/396 R; 250/397
(58) Field of Search .................. 313/111.01, 111.31; 250/396 R, 396 MC, 423 R, 424, 492.1, 492.2, 492.21, 452.22, 492.3, 397, 398

(56) References Cited

U.S. PATENT DOCUMENTS

| | | | |
|---|---|---|---|
| 4,922,106 A | * 5/1990 | Berrian et al. | 250/492.2 |
| 5,039,861 A | 8/1991 | Swenson | |
| 5,180,918 A | 1/1993 | Isobe | |
| 5,350,926 A | * 9/1994 | White et al. | 250/492.21 |
| 5,422,490 A | * 6/1995 | Nakamura et al. | 250/492.21 |
| 5,444,234 A | 8/1995 | Hennerici et al. | |
| 5,641,969 A | * 6/1997 | Cooke et al. | 250/492.21 |
| 5,696,382 A | 12/1997 | Kwon | |
| 5,760,409 A | 6/1998 | Chen et al. | |
| 5,898,179 A | 4/1999 | Smick et al. | |
| 5,909,622 A | 6/1999 | Kadosh et al. | |
| 6,054,715 A | 4/2000 | Nissborg et al. | |
| 6,163,033 A | * 12/2000 | Smick et al. | 250/441.11 |
| 6,437,350 B1 | * 8/2002 | Olson et al. | 250/492.21 |
| 6,573,518 B1 | * 6/2003 | Renau et al. | 250/492.21 |

OTHER PUBLICATIONS

Sturans et al., Optimization of variable axis immersion lens for resolution and normal landing, J. Vac. Sci. Technol. B, vol. 8, No. 6, (Nov./Dec. 1990), pp. 1682–1685.

Kunibe, et al, Measurement for divergence angle of ion beams extracted from the Bernas type ion source, Ion Implantation Proceedings, Int. Conf, Kyoto, 1998, pp. 424–427.

\* cited by examiner

*Primary Examiner*—Bruce Anderson
*Assistant Examiner*—David A. Vanore

(57) ABSTRACT

A device for measuring an incidence angle of an ion beam impinging a planar substrate includes an aperture plate having an aperture for intercepting the ion beam and passing a beam portion therethrough, and a sensor located in the substrate plane or a plane parallel thereto behind the aperture plate and having a length along which the beam portion impinges on the sensor at a location which is a function of the incidence angle of the ion beam, the sensor configured to produce a sensor signal indicative of the location of impingement of the beam portion on the sensor and representative of incidence angle. A computing unit may be configured to compare the sensor signal to a predetermined function for determining the incidence angle of the ion beam. Spaced apart sensing devices may be used to determine beam divergence.

28 Claims, 7 Drawing Sheets

ION BEAM INCIDENCE ANGLE AND BEAM DIVERGENCE MONITOR

CROSS-REFERENCE TO RELATED APPLICATION

This application claims the benefit of provisional application Ser. No. 60/262,245, filed Jan. 17, 2001, which is hereby incorporated by reference.

FIELD OF THE INVENTION

This invention relates to systems and methods for treatment of workpieces, such as semiconductor wafers, with an ion beam and, more particularly, to methods and apparatus for measuring the incidence angle and divergence of the ion beam.

BACKGROUND OF THE INVENTION

In the manufacture of semiconductor devices using ion implantation, it is sometimes desirable to provide beam incidence angles which are other than perpendicular to the substrate plane. A description of ion implantation techniques using tilted implantation steps can be found in U.S. Pat. No. 5,696,382, issued Dec. 9, 1997 to Kwon, and U.S. Pat. No. 5,909,622, issued Jun. 1, 1999 to Kadosh et al. As device geometries are reduced, semiconductor manufacturers increasingly require improved accuracy in measuring and controlling beam incidence angle in ion implanters.

Further, semiconductor device manufacturers typically require the use of parallel scan techniques, wherein the ion beam has a constant angle of incidence on the semiconductor wafer.

Prior art techniques for measuring beam incidence angles typically involve measurement of the wafer chuck or supporting hardware at maintenance intervals. Such measurements can be correlated with implant angles determined by crystallographic examination of test wafers implanted at specified settings. Such techniques are tedious, have limited accuracies, do not provide real time measurements of the beam and do not provide any measurement of beam divergence.

U.S. Pat. No. 5,180,918, issued Jan. 19, 1993 to Isobe, describes a method and apparatus for measuring ion beam collimation, shaping the ion beam and controlling scanning thereof. The method utilizes a time-dependent change in the scanning position of the ion beam at an upstream location and a downstream location at mutually corresponding times.

It is desirable to provide a simple sensor system which allows ion beam incidence angle to be monitored in real time in order to comply with requirements of semiconductor manufacturers for reduced incidence angle tolerances. It is also desirable to determine deviation from a desired incidence angle, to permit accurate adjustment thereof, and to determine beam divergence (angular variation across the beam).

SUMMARY OF THE INVENTION

In one aspect, the invention relates to a sensing device which monitors the incidence angle of an ion beam in real time. The sensing device includes an aperture plate having an aperture for intercepting the ion beam and passing a beam portion therethrough, and a sensor located in the substrate plane or a plane parallel thereto behind the aperture and having a length along which the beam portion impinges on the sensor at a location which is a function of the incidence angle of the ion beam, the sensor being configured to produce a sensor signal indicative of the location of impingement of the beam portion on the sensor and representative of incidence angle. A computing unit may be configured to receive the sensor signal and compare it to a predetermined function for determining the incidence angle of the ion beam from the sensor signal.

The sensing device described above provides an incidence angle measurement with respect to one dimension of the substrate plane. Two dimensional measurement may be provided with an X-Y angle sensing apparatus which includes first and second sensing devices disposed orthogonal to each other in a plane parallel to the substrate plane.

The invention may be used while a semiconductor wafer is being processed, providing data on ion beam characteristics during implant. The sensing device may be mounted in an ion implanter to intercept unused areas of the ion beam to permit concurrent ion implantation and beam monitoring. Additionally, as beam properties are held stable, mechanical alignments may be checked for precision and accuracy, without the use of cumbersome measurement devices or procedures. Monitoring may be performed in vacuum, thereby eliminating possible discrepancies between measurements in vacuum and measurements in atmosphere.

According to another aspect of the invention, apparatus is provided for sensing an incidence angle of an ion beam on a substrate plane. The apparatus comprises an aperture plate having an aperture for passing a portion of the ion beam, and a position-sensitive sensor spaced from the aperture plate and located in or parallel to the substrate plane for intercepting the beam portion and producing a sensor signal that is representative of a location of impingement of the beam portion on the sensor and is thereby representative of the incidence angle of the ion beam on the substrate.

The position-sensitive sensor may comprise a resistor block having a length along which the beam portion impinges on the sensor and an output terminal which produces the sensor signal. The apparatus may further comprise a computing unit for determining the incidence angle of the ion beam in response to the sensor signal. The computing unit may determine the incidence angle of the ion beam from calibration data.

According to a further aspect of the invention, apparatus is provided for sensing divergence of an ion beam. The apparatus comprises a first incidence angle sensor for sensing a first incidence angle of the ion beam with respect to a substrate plane, a second incidence angle sensor, spaced apart from the first incidence angle sensor, for sensing a second incidence angle of the ion beam with respect to the substrate plane, and a computing device for determining divergence of the ion beam based on the first and second incidence angles.

The first and second incidence angle sensors may each comprise an aperture plate having an aperture for passing a portion of the ion beam, and a position-sensitive sensor spaced from the aperture plate and located in or parallel to the substrate plane for intercepting the beam portion and producing a sensor signal that is representative of a location of impingement of the beam portion on the sensor and is thereby representative of the incidence angle of the ion beam on the substrate plane.

The computing device may determine the first and second incidence angles based on calibration data and may determine divergence of the ion beam based on a difference between the first and second incidence angles.

BRIEF DESCRIPTION OF THE DRAWINGS

For a better understanding of the present invention, reference is made to the accompanying drawings, which are incorporated herein by reference and in which.

DETAILED DESCRIPTION

Figure 1:
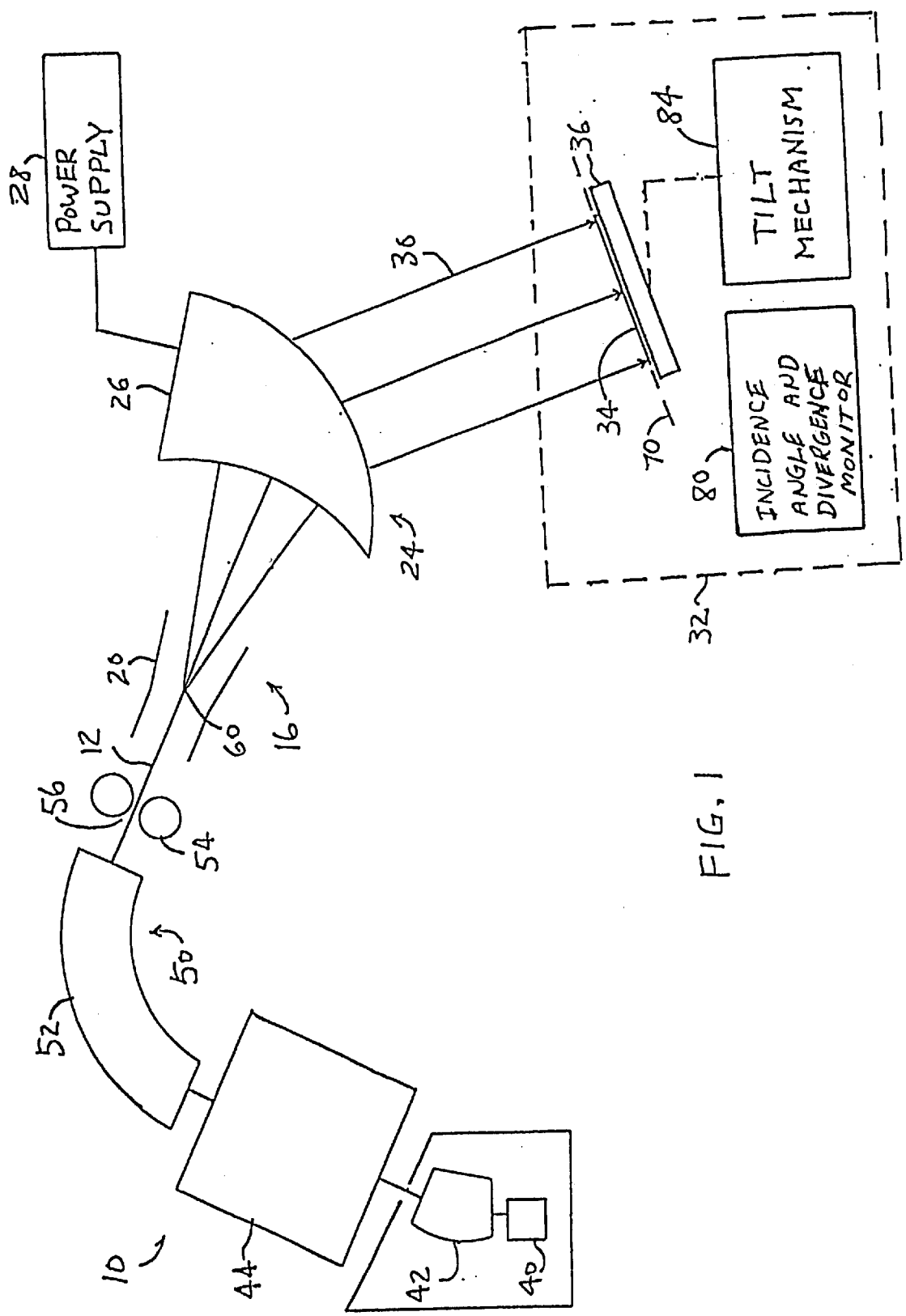
FIG. 1 is a simplified schematic block diagram of an ion implanter.

A simplified block diagram of an example of an ion implanter suitable for incorporating the present invention is shown in FIG. 1. An ion beam generator 10 generates an ion beam of a desired species, accelerates ions in the ion beam to desired energies, performs mass/energy analysis of the ion beam to remove energy and mass contaminants and supplies an energetic ion beam 12 having a low level of energy and mass contaminants. A scanning system 16, which includes a scanner 20 and an angle corrector 24, deflects the ion beam 12 to produce a scanned ion beam 30 having parallel or nearly parallel ion trajectories. An end station 32 includes a platen 36 that supports a semiconductor wafer 34 or other workpiece in the path of scanned ion beam 30 such that ions of the desired species are implanted into the semiconductor wafer 34. The platen 36 may be scanned perpendicular to ion beam 30 to distribute the ion beam over the surface of wafer 34.

The ion implanter may include additional components well known to those skilled in the art. For example, the end station 32 typically includes automated wafer handling equipment for introducing wafers into the ion implanter and for removing wafers after implantation, a dose measuring system, an electron flood gun, etc. It will be understood that the entire path traversed by the ion beam is evacuated during ion implantation.

The principal components of ion beam generator 10 include an ion beam source 40, a source filter 42, an acceleration/deceleration column 44 and a mass analyzer 50. The source filter 42 is preferably positioned in close proximity to ion beam source 40. The acceleration/deceleration column 44 is positioned between source filter 42 and mass analyzer 50. The mass analyzer 50 includes a dipole analyzing magnet 52 and a mask 54 having a resolving aperture 56.

The scanner 20, which may be an electrostatic scanner, deflects ion beam 12 to produce a scanned ion beam having ion trajectories which diverge from a scan origin 60. The scanner 20 may comprise spaced-apart scan plates connected to a scan generator. The scan generator applies a scan voltage waveform, such as a sawtooth waveform, for scanning the ion beam in accordance with the electric field between the scan plates.

Angle corrector 24 is designed to deflect ions in the scanned ion beam to produce scanned ion beam 30 having parallel ion trajectories, thus focusing the scanned ion beam. In particular, angle corrector 24 may comprise magnetic polepieces 26, which are spaced apart to define a gap, and a magnet coil (not shown) which is coupled to a power supply 28. The scanned ion beam passes through the gap between the pole pieces 26 and is deflected in accordance with the magnetic field in the gap. The magnetic field may be adjusted by varying the current through the magnet coil. Beam scanning and beam focusing are performed in a selected plane, such as a horizontal plane.

In the embodiment of FIG. 1, end station 32 includes a beam incidence angle and beam divergence monitor 80. Monitor 80 measures beam incidence angle and divergence as described below. In addition, end station 32 may include a tilt mechanism 84 for tilting wafer support platen 36 with respect to the scanned ion beam 30. In one embodiment, tilt mechanism 84 may tilt wafer support platen 36 with respect to two orthogonal axes.

A variety of different ion implanter architectures are known to those skilled in the art. For example, the ion beam may be distributed over the wafer by beam scanning, by wafer movement or by a combination of beam scanning and wafer movement. Examples of ion implanter architectures are disclosed in U.S. Pat. No. 4,922,106 issued May 1, 1999 to Berrian et al, U.S. Pat. No. 4,899,059 issued Feb. 6, 1990 to Freytsis et al and U.S. Pat. No. 5,350,926 issued Sep. 27, 1994 to White et al. The present invention may be utilized in any ion implanter architecture where it is desired to measure beam incidence angle and/or beam divergence.

According to an aspect of the invention, an apparatus and method are provided for measuring an incidence angle of beam 30 with respect to wafer 34. An incidence angle 27 may be defined as the angle between the direction of ion beam 30 and a normal to the plane 70 of wafer 34, as shown in FIGS. 1–3.

Figure 2:
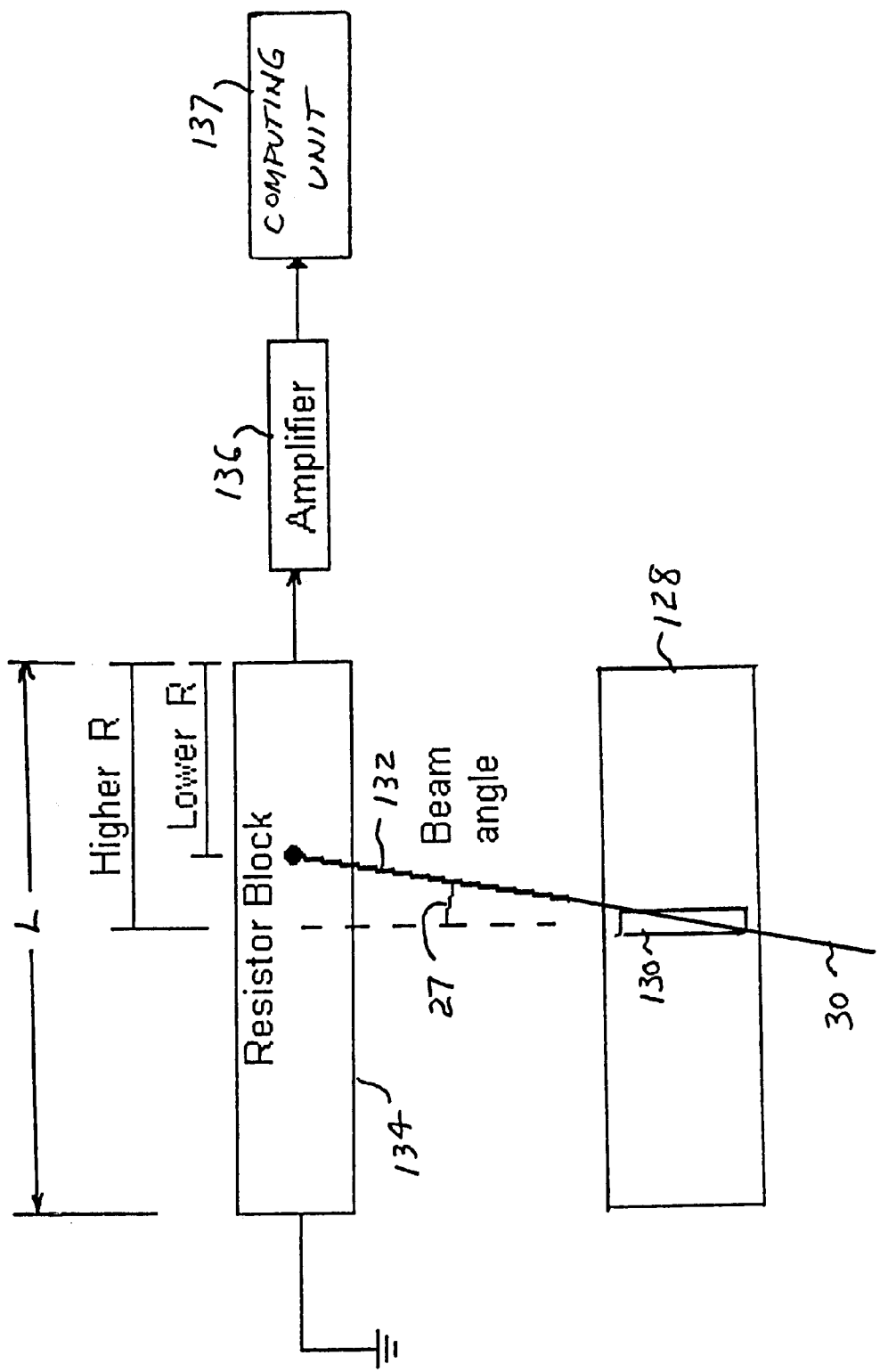
FIG. 2 is a schematic block diagram of an incidence angle sensor apparatus in accordance with an embodiment of the invention.
Figure 3:
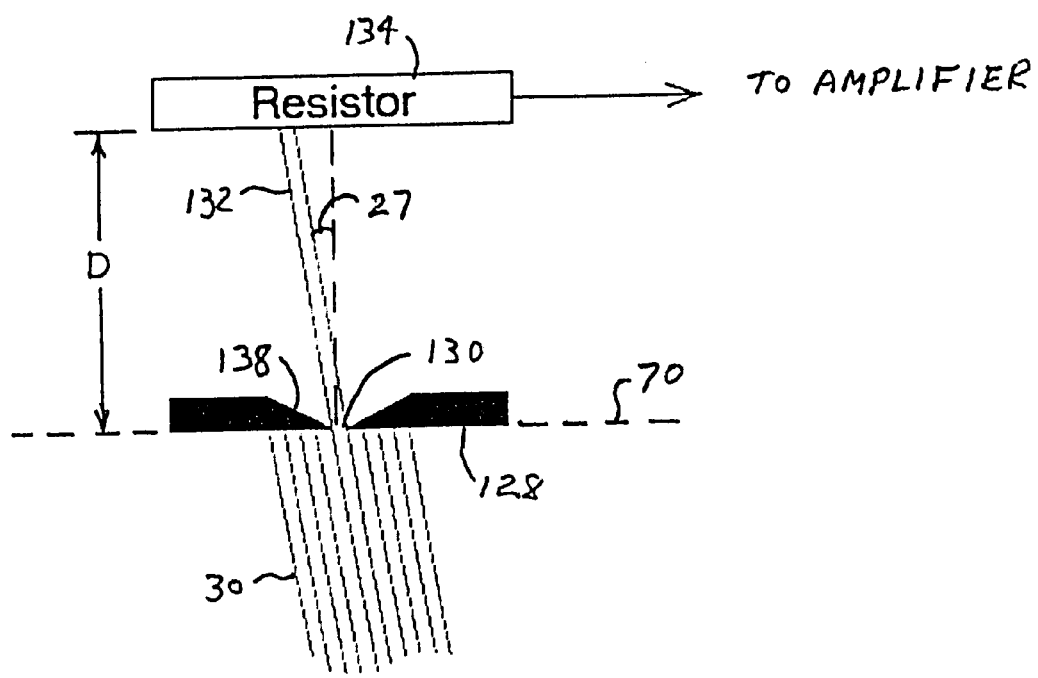
FIG. 3 is a schematic sectional view of a portion of the incidence angle sensor apparatus shown in FIG. 2.

A one-dimensional incidence angle sensor in accordance with an embodiment of the invention is illustrated in FIGS. 2 and 3. An aperture plate 128 having a narrow aperture 130 of fixed width is placed in ion beam 30 to allow passage of a narrow width beam portion 132 of known cross section. Beam portion 132 impinges on a resistor block 134 which has a length L. The resistor block 134 is placed in the plane 70 of wafer 34 or in a plane parallel thereto. One end of resistor block 134, along the length L, is connected to an amplifier 136, the output of which is supplied to a computing unit 137 which determines incidence angle 27. Computing unit 137 may include an analog-to-digital converter for converting the output of amplifier 136 to a digital value. The other end of the resistor block 134, along the length L, can float electrically, or may be connected to a reference potential, such as ground, to limit noise.

As the ion beam impinges on resistor block 134, a current flow change or voltage change to the amplifier 136 is generated. The distance which the current must travel through the resistor block 134 to the amplifier 136 varies depending on the location along length L where the beam portion 132 impinges on the resistor block 134. The electrical resistance between the location where the ion beam 30 impinges on resistor block 134 and the location where resistor block 134 is connected to amplifier 36 varies according to the incidence angle 27 of the ion beam 30. The variation in resistance results in a beam location-dependent variation in a sensor signal input to the amplifier 136. The sensor signal input to the amplifier 136 represents the beam incidence angle and may be used to determine the beam incidence angle. A calibration can be performed to determine resistor value at a "known" or mechanically verified zero-degree or other known angle setting. Relative values may then be used to determine incidence angle.

The resistor block 134 may be any sufficiently resistive material. It may be as wide (in a direction perpendicular to the angular measurement) as necessary to collect enough ions of the ion beam 30 to provide a workable signal-to-noise ratio. The resistor block 134, in a preferred embodiment, is a thin or thick-film deposited material, such as silicon or carbon, with homogenous electrical properties.

Referring to FIG. 3, the aperture 130, in the preferred embodiment, is a slit in plate 128, which is preferably made of graphite. The backside of the slit may have a beveled edge 138 to permit the plate 128 to be sufficiently thick to prevent heat distortion, while simultaneously preventing the beam from being blocked by aperture sides at large incident angles. The plate 128 may alternately be formed of a metal or ceramic material, and may also be formed of movable elements defining a slit of variable width. A metal plate or metal plate elements may be water cooled to prevent heat distortion, and may be coated with a material, such as silicon or a ceramic, to prevent sputtering into the implant chamber. The aperture plate 128 may be fastened to the resistor block 134 to maintain plate 128 at a fixed, accurate distance D from resistor block 134. For any given incidence angle, a larger distance D produces a greater distance difference along the resistor block 134 between the calibration location and the measurement location. Consequently, the distance D can be selected to obtain a desired precision for incidence angle measurement.

The sensor signal from resistor block 134 is supplied through amplifier 136 to computing unit 137. Computing unit 137 may be part of an ion implanter controller or may be a dedicated analysis circuit. Computing unit 137 may be implemented as a microprocessor or as a special purpose circuit. The computing unit 137 analyzes the sensor signal to determine a beam incidence angle. In one embodiment, the sensor signal is calibrated by applying to the apparatus an ion beam at a series of known incidence angles. The sensor signals are recorded for each known incidence angle to generate a calibration curve or table which contains sensor signal values and corresponding incidence angle values. When an ion beam having an unknown incidence angle is measured, the incidence angle is determined by comparing the sensor signal to the calibration curve or table.

The above-described sensor can measure the incidence angle along one axis or direction. In a preferred embodiment, an ion beam incidence angle and beam divergence monitor uses otherwise unused portions of an ion beam: 1) to determine the angle at which the ion beam is impinging on a semiconductor wafer, and, alternately or additionally, 2) to determine the amount, if any, of ion beam divergence or convergence (i.e. negative divergence).

Figure 4:
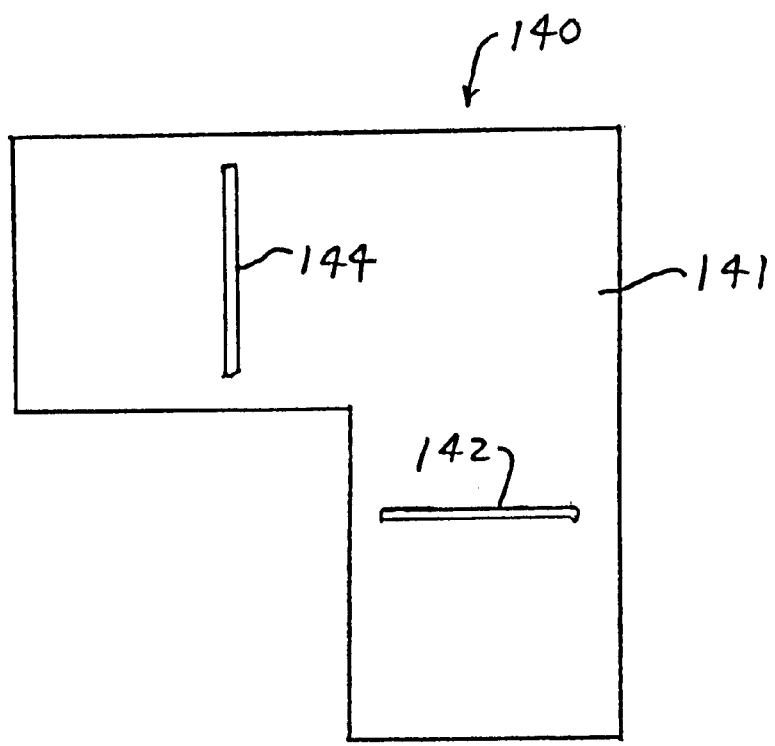
FIG. 4 is a schematic view of a sensor apparatus in accordance with an embodiment of the invention, which is adapted to determine incidence angle in two dimensions, viewed from the upstream side relative to the ion beam direction.
Figure 5:
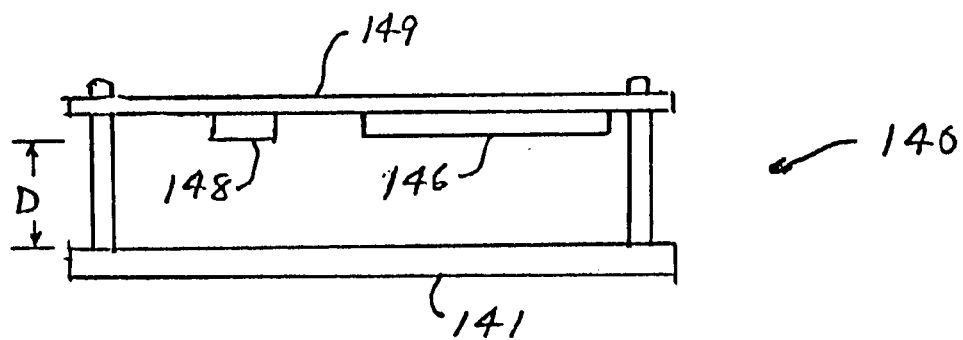
FIG. 5 is a view of the sensor of FIG. 4 taken along line 5—5 of FIG. 4.

A measurement device for measuring an incidence angle of an ion beam impinging on a planar substrate in two dimensions of the substrate plane can be provided in accordance with embodiments of the invention. Such a device includes a pair of sensors as described above, each member of the pair being located in the substrate plane or a plane parallel thereto and the members of the pair being disposed orthogonal to each other. FIGS. 4 and 5 illustrate an X-Y angle sensor 140. X-Y sensor 140 includes an aperture plate 141 having apertures 142 and 144 orthogonal to each other. The apertures 142 and 144 are associated with resistor blocks 146 and 148, respectively, of length L, mounted at a fixed distance D from plate 141. Resistor blocks 146 and 148 are mounted on a substrate 149, such as a printed circuit board. Outputs from the resistor blocks 146 and 148, amplified as needed, provide signals which can be analyzed to provide a two-dimensional measurement of incidence angle (i.e. an X angle and a Y-angle) and/or a two-dimensional measurement of beam divergence.

Figure 6:
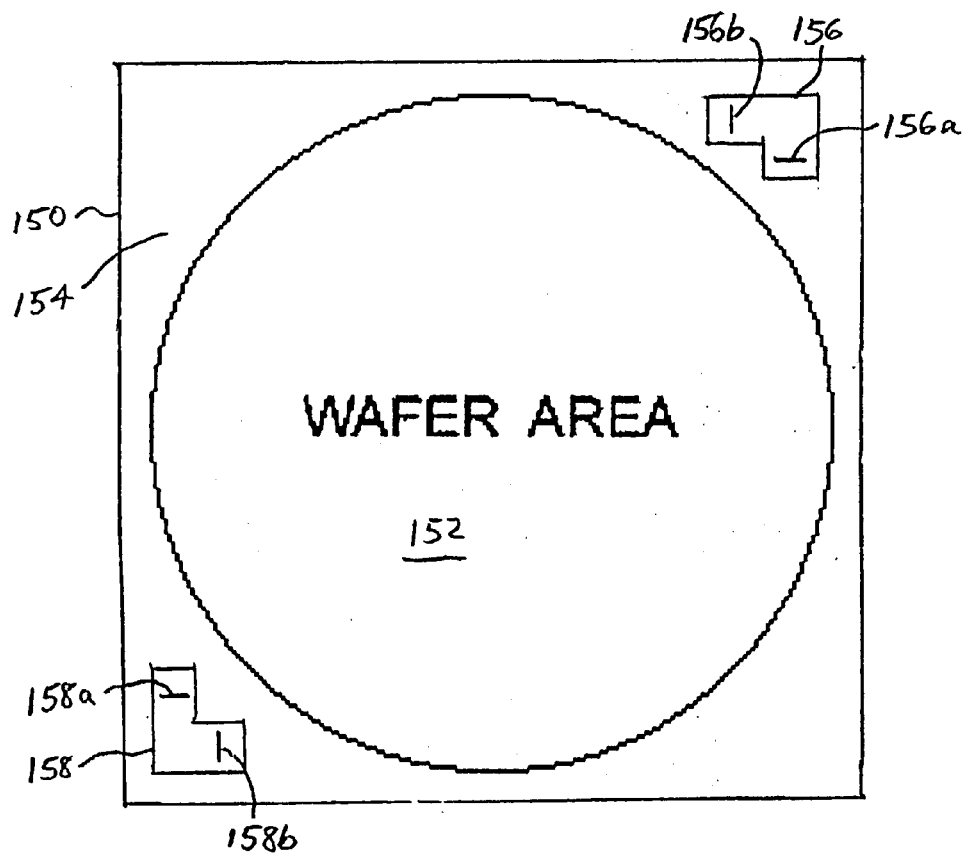
FIG. 6 is a schematic view of the area scanned by an ion beam in the target chamber of an ion implanter incorporating a pair of sensors as shown in FIG. 4, viewed from upstream side of the ion beam.

FIG. 6 shows an area 150 in the substrate plane scanned by the ion beam of a typical ion implanter. The area 150 scanned by the beam is larger than a wafer area 152. At least a part of the remaining area 154 is unused. One or more sensors, such X-Y sensors 156 and 158, are positioned to intercept the unused area of the beam, thereby permitting real-time monitoring (i.e. concurrent with ion implantation or other wafer treatment) of beam incidence angle. The two X-Y sensors 156 and 158 are spaced apart and are located on opposite sides of wafer area 152. Sensor 156 includes Y1 sensor 156*a* and X1 sensor 156*b*. Sensor 158 includes Y2 sensor 158*a* and X2 sensor 158*b*. Sensors 156 and 158 are the sensors of an ion beam incidence angle and beam divergence monitor, as described below.

Angle measurements taken by sensors 156 and 158 provide X and Y incidence angles at two locations. The difference between the incidence angle measurements along each axis or direction represents the beam divergence. Monitoring of divergence permits correction by manipulation of the ion beam profile until an acceptable divergence has been obtained. Such corrections may be performed automatically in real-time during ion implantation in response to sensing a deviation from a preset value or a range of values.

Figure 8:
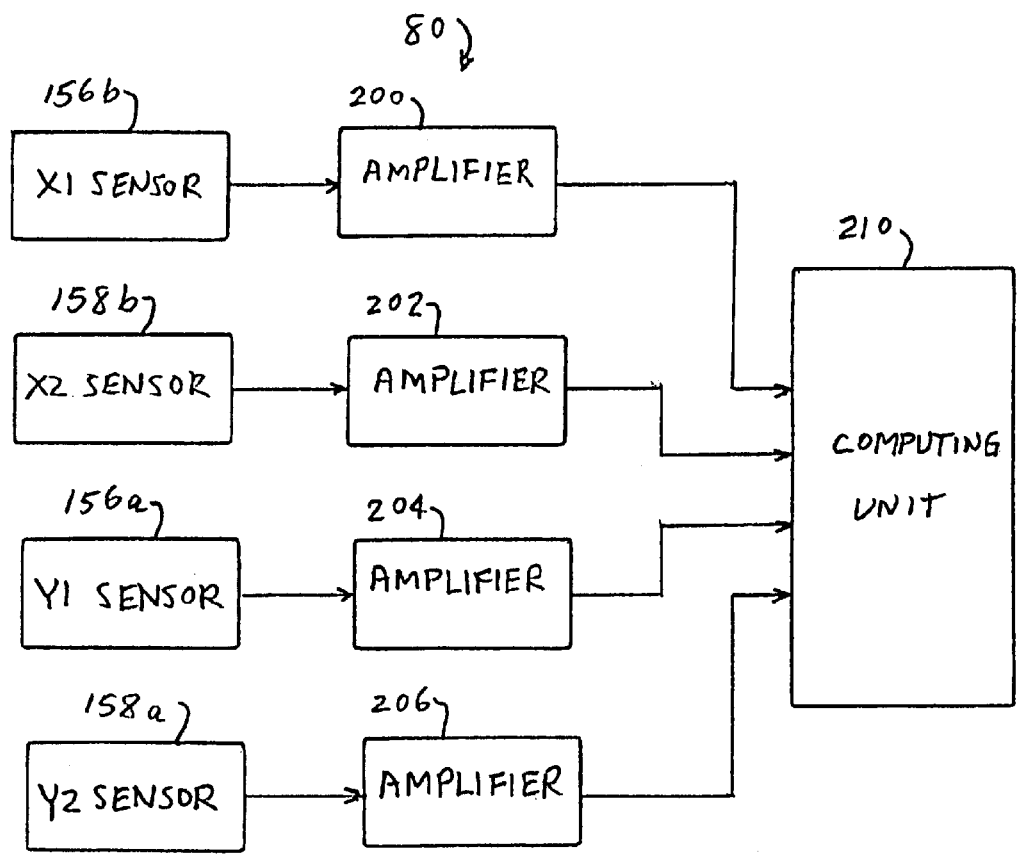
FIG. 8 is a block diagram of an ion beam incidence angle and beam divergence monitor in accordance with an embodiment of the invention.

A block diagram of ion beam incidence angle and divergence monitor 80 is shown in FIG. 8. Like elements in FIGS. 6 and 8 have the same reference numerals. Each of the sensors 158*a*, 158*b*, 156*a* and 156*b* may include an aperture plate having an aperture spaced from a position-sensitive sensor, such as a resistor block, as described above. The sensor signals from sensors 156*b*, 158*b*, 156*a* and 158*b* are supplied through amplifiers 200, 202, 204 and 206, respectively, to a computing unit 210. The computing unit 210 may include one or more analog-to-digital converters for converting the outputs of amplifiers 200, 202, 204, and 206 to digital values. The computing unit 210 may analyze the sensor signal from each individual sensor by comparing the amplified sensor signal value with a calibration curve or table to determine an incidence angle. Sensors 156*b* and 158*b* provide incidence angle measurements in the X direction, and sensors 156*a* and 158*a* provide incidence angle measurements in the Y direction. The computing unit 210 may subtract the incidence angle measurements acquired by X direction sensors 156*b* and 158*b* to determine beam divergence in the X direction and may subtract the incidence angle measurements acquired by Y direction sensors 156*a* and 158*a* to determine beam divergence in the Y direction. As noted above, a negative value of beam divergence represents a converging beam. The measured values of incidence angle and beam divergence may be utilized to adjust the beamline and/or the tilt of the wafer via tilt mechanism 84 (FIG. 1), as necessary. The adjustment may be manual or automatic within the scope of the invention.

Figure 7:
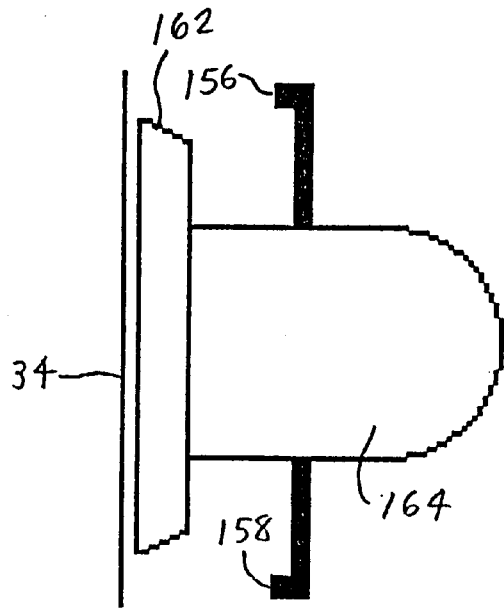
FIG. 7 is a schematic view of a region of the target chamber of an ion implanter, viewed from the side relative to the ion beam.

FIG. 7 illustrates an embodiment of the sensors mounted in an implanter. A substrate holder 160 includes a platen 162 holding wafer 34. Platen 162 is mounted on a shaft 164 which extends rearwardly behind the substrate. X-Y sensors 156 and 158 are mounted to shaft 164 in a plane parallel to and behind the wafer and intercept beam portions passing through the unused beam area around the wafer 34.

The resistivity of the resistor block may change over time as dopants are implanted therein. However, the change in resistivity in most cases is small per wafer implant, and a recalibration procedure can be performed when necessary to adjust for these changes. The resistor block is cleanable and replaceable in a preferred embodiment. Other embodiments of the resistor block may include a resistive wire coil, as is commonly used in rheostats, or patterned metal traces on a printed circuit board.

Recalibration can easily be accomplished as the implanter and the sensor have a fixed operative range of angular variation, which defines the end points of a line or curve corresponding to the maximum and minimum sensor signals obtainable. The absolute values corresponding to these maxima and minima can be redefined at any time by moving the implanter beamline to the end points and monitoring the corresponding sensor signals obtained. In general, it is also usually possible to reorient the beam or the substrate to provide a zero angle measurement, so that resistance drift at this point can be periodically monitored and used for recalibration.

Periodic recalibration of the monitor device can be incorporated into the production cycle, for instance by programming a wafer handler to load a calibration blank rather than a production wafer from a prescribed storage location, or by including a calibration blank with the production wafers at fixed intervals, and running the recalibration scan while the calibration blank is in the implanter. The production cycle then can continue using the revised curve without breaking vacuum. Thus the sensor can continue to be operated within acceptable tolerances for extended times without significant disruption of the production cycle. Further, the resistors can be manufactured to be easily cleanable and/or replaceable, so that if sensitivity becomes too low over the length of the resistor, or if resistance drift due to implantation eventually becomes too localized for a reasonably accurate angular curve to be obtained, replacement of the resistor, and a calibration as described above permit a rapid resumption of the production cycle.

Figure 9:
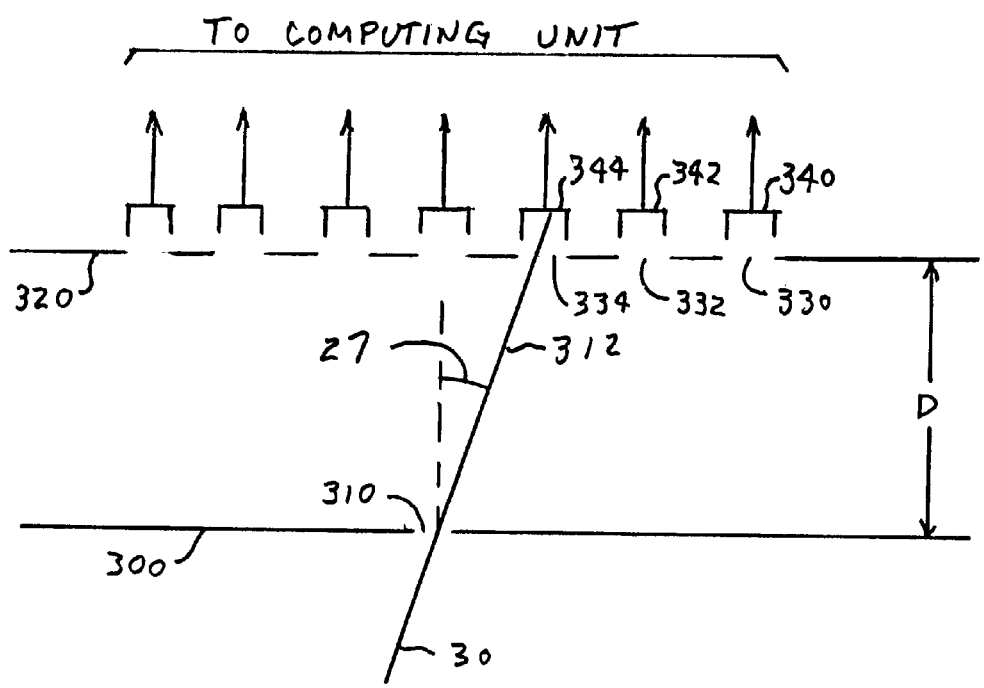
FIG. 9 is a schematic block diagram of an incidence angle sensor apparatus in accordance with another embodiment of the invention.

Another embodiment of a one-dimensional incidence angle sensor in accordance with the invention is illustrated in FIG. 9. An aperture plate 300 having a narrow aperture 310 of fixed width is placed in ion beam 30 to allow passage of a narrow width beam portion 312 of known cross section. Beam portion 312 impinges on a second aperture plate 320 having a plurality of apertures 330, 332, 334, etc. Aperture plate 320 is placed in the plane 70 of wafer 34 or in a parallel thereto and is spaced from aperture plate 300 by a known distance D. Beam sensors 340, 342, 344, etc. are positioned behind apertures 330, 332, 334, etc., respectively, for sensing beam portion 312. The beam sensors 340, 342, 344, etc. may for example be small Faraday cups. The beam sensors 340, 342, 344, etc. are connected through appropriate signal processing circuitry to a computing unit (not shown). When beam portion 312 passes through one of the apertures in plate 320 and is sensed by one of the beam sensors, the sensor signal produced by that beam sensor indicates a known value of incidence angle 27.

The embodiment of FIG. 9 provides measurement of a number of known fixed angles. The measurement resolution depends on the spacing between apertures 330, 332, 334, etc. in aperture plate 320, the sizes of the apertures in aperture plates 300 and 320 and the distance D between aperture plates 300 and 320. It will be understood that FIG. 9 is not drawn to scale and that a practical implementation of the incidence angle sensor would have a larger number of apertures in aperture plate 320 and a smaller spacing between apertures.

In yet another embodiment, the second aperture plate 320 is omitted, and a plurality of beam sensors 340, 342, 344, etc. is used to sense beam portion 312 at multiple discrete incidence angles. In this embodiment, the measurement resolution is determined by the size of the beam sensor aperture and the spacing between beam sensors, as well as the size of aperture 310 and the distance D. When the beam portion 312 is sensed by one of the beam sensors, the sensor signal produced by that beam sensor indicates a known value of incidence angle 27.

The above description is intended to be illustrative and not exhaustive. The description will suggest many variations and alternatives to one of ordinary skill in this art. All these alternatives and variations are intended to be included within the scope of the attached claims. Those familiar with the art may recognize other equivalents to the specific embodiments described herein which equivalents are also intended to be encompassed by the claims attached hereto. Further, the particular features presented in the dependent claims below can be combined with each other in other manners within the scope of the invention such that the invention should be recognized as also specifically directed to other embodiments having any other possible combination of the features of the dependent claims.

What is claimed is:

1. A device for measuring an incidence angle of an ion beam on a substrate plane, the apparatus comprising:

an aperture plate having an aperture for intercepting the ion beam and passing a beam portion therethrough;

a sensor located in the substrate plane or a plane parallel thereto behind the aperture plate and having a length along which the beam portion impinges on the sensor at a location which is a function of the incidence angle of the ion beam, the sensor configured to produce a sensor signal indicative of the location of impingement of the beam portion on the sensor, and a computing unit configured to receive the sensor signal and compare it to a predetermined function for determining the incidence angle of the ion beam from the sensor signal.

2. A device as in claim 1 wherein the sensor comprises a resistor, the beam portion impinging on said resistor and thereby producing a current and voltage indicative of a location on the resistor.

3. A device as in claim 2 wherein the sensor further comprises an amplifier which receives a current or voltage generated by impingement of the ion beam portion on the resistor and amplifies said current or voltage to produce said sensor signal.

4. A device as in claim 2 wherein the resistor is removably mounted in a holder which presents the resistor in said plane parallel to the substrate.

5. A device as in claim 1 wherein the sensor comprises a second aperture plate spaced from the first aperture plate, said second aperture plate having a plurality of spaced-apart apertures, and beam sensors positioned behind each of the spaced-apart apertures in the second aperture plate for producing the sensor signal when the beam portion passes through one of the apertures in the second aperture plate.

6. An ion implanter comprising a measuring device as in claim 1.

7. A method of measuring an incidence angle of an ion beam on a substrate plane, the method comprising passing a portion of the beam through an aperture and causing the beam portion to impinge on a beam sensor located in the substrate plane, or in a plane parallel thereto, behind the aperture and having a length along which the beam portion impingement occurs at a location which is a function of the incidence angle of the beam, said beam sensor producing a sensor signal which is indicative of the location of impingement of the beam along the length thereof;

comparing said sensor signal to a predetermined function for determining the beam incidence angle from the sensor signal, and outputting a measurement of the incidence angle.

8. A method as in claim 7 wherein beam sensor comprises a resistor, and the beam portion impinges on said resistor to produce a current and voltage indicative of a location on the resistor.

9. A method as in claim 7 wherein the beam sensor further comprises an amplifier which receives a current or voltage generated by impingement of the ion beam portion on the resistor and amplifies said current or voltage to produce said sensor signal.

10. A method as in claim 7 employing a pair of measuring devices comprising a pair of said apertures and sensors, the members of said pair being disposed in said plane orthogonal to each other and defining an X axis direction and a Y axis direction respectively, and wherein the incidence angle measurement is provided with respect to both the X axis direction and the Y axis direction.

11. A method of determining beam angle divergence of an ion beam in a substrate plane, the method comprising concurrently monitoring a beam incidence angle in at least two different locations in a monitoring plane with respect to at least one axis direction of the monitoring plane, the monitoring plane corresponding to the substrate plane or a plane parallel to the substrate plane, and comparing the beam incidence angles monitored at each location to determine beam angle divergence therebetween with respect to said axis direction.

12. A method as in claim 11 wherein said monitoring is performed at each location with respect to two axis directions, said two axis directions being perpendicular to each other in the monitoring plane.

13. A method of correcting beam angle divergence in an ion beam of an ion implanter comprising determining beam angle divergence by a method in accordance with claim 12 in real-time, and altering a profile of the ion beam in response to said beam angle divergence determination until a correction said divergence has been accomplished.

14. Apparatus for sensing an incidence angle of an ion beam on a substrate plane, comprising:

an aperture plate having an aperture for passing a portion of the ion beam; and a position-sensitive sensor spaced from the aperture plate and located in or parallel to the substrate plane for intercepting the beam portion and producing a sensor signal that is representative of a location of impingement of the beam portion on the sensor and is thereby representative of the incidence angle of the ion beam on the substrate plane.

15. Apparatus as defined in claim 14 wherein the position-sensitive sensor comprises a resistor block having a length along which the beam portion impinges on the sensor and an output terminal which produces the sensor signal.

16. Apparatus as defined in claim 15 further comprising a computing unit for determining the incidence angle of the ion beam in response to the sensor signal.

17. Apparatus as defined in claim 16 wherein the computing unit determines the incidence angle of the ion beam from calibration data.

18. Apparatus as defined in claim 14 wherein the position-sensitive sensor comprises a second aperture plate spaced from the first aperture plate, the second aperture plate having a plurality of spaced-apart apertures, and beam sensors positioned behind each of the apertures in the second aperture plate for producing the sensor signal when the beam portion passes through one of the apertures in the second aperture plate.

19. Apparatus as defined in claim 14 wherein the position-sensitive sensor comprises a plurality of beam sensors spaced from the first aperture plate for producing the sensor signal when the beam portion is intercepted by one of the beam sensors.

20. Apparatus for sensing divergence of an ion beam, comprising:

a first incidence angle sensor for sensing a first incidence angle of the ion beam with respect to a substrate plane;

a second incidence angle sensor, spaced apart from the first incidence angle sensor, for sensing a second incidence angle of the ion beam with respect to the substrate plane; and a computing device for determining divergence of the ion beam based on the first and second incidence angles.

21. Apparatus as defined in claim 20 wherein said first incidence angle sensor and said second incidence angle sensor each comprise:

an aperture plate having an aperture for passing a portion of the ion beam; and a position-sensitive sensor spaced from the aperture plate and located in or parallel to the substrate plane for intercepting the beam portion and producing a sensor signal that is representative of a location of impingement of the beam portion on the sensor and is thereby representative of the incidence angle of the ion beam on the substrate plane.

22. Apparatus as defined in claim 21 wherein the position-sensitive sensor in each of said incidence angle sensors comprises a resistor block having a length along which the beam portion impinges on the sensor and an output terminal for providing the sensor signal.

23. Apparatus as defined in claim 22 wherein said computing device determines the first and second incidence angles based on calibration data.

24. Apparatus as defined in claim 20 wherein said computing device determines divergence of the ion beam based on a difference between the first and second incidence angles.

25. Apparatus as defined in claim 20 wherein the position-sensitive sensor in each of said incident angle sensors comprises a second aperture plate spaced from the first aperture plate, the second aperture plate having a plurality of spaced-apart apertures, and beam sensors positioned behind each of the apertures in the second aperture plate for producing the sensor signal when the beam portion passes through one of the apertures in the second aperture plate.

26. Apparatus for sensing an incidence angle of an ion beam on a substrate plane, comprising:

an aperture plate having an aperture for passing a portion of the ion beam; and a resistor block spaced from the aperture plate and located in or parallel to the substrate plate for intercepting the beam portion, said resistor block having a length along which the beam portion impinges and an output terminal which produces a sensor signal that is representative of a location of impingement of the beam portion on the resistor block and is thereby representative of the incidence angle of the ion beam on the substrate plane.

27. Apparatus as defined in claim 26 further comprising a computing unit for determining the incidence angle of the ion beam in response to the sensor signal.

28. Apparatus for sensing divergence of an ion beam, comprising:

first and second spaced-apart incidence angle sensors for sensing first and second incidence angles, respectively, of the ion beam with respect to a substrate plane, said first and second incidence angle sensors each comprising an aperture plate having an aperture for passing a portion of the ion beam and a resistor block spaced from the aperture plate and located in or parallel to the substrate plane for intercepting the beam portion, said resistor block having a length along which the beam portion impinges and an output terminal for providing a sensor signal that is representative of a location of impingement of the beam portion on the sensor and is thereby representative of the incidence angle of the ion beam on the substrate plate; and a computing device for determining the first and second incidence angles based on calibration data and for determining the divergence of the ion beam based on a difference between the first and second incidence angles.

* * * * *